US008502279B2

(12) United States Patent
Toh et al.

(10) Patent No.: US 8,502,279 B2
(45) Date of Patent: Aug. 6, 2013

(54) NANO-ELECTRO-MECHANICAL SYSTEM (NEMS) STRUCTURES WITH ACTUATABLE SEMICONDUCTOR FIN ON BULK SUBSTRATES

(75) Inventors: Eng Huat Toh, Singapore (SG); Elgin Quek, Singapore (SG); Chung Foong Tan, Yishun Sapphire (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 155 days.

(21) Appl. No.: 13/108,439

(22) Filed: May 16, 2011

(65) Prior Publication Data

US 2012/0292707 A1 Nov. 22, 2012

(51) Int. Cl.
 H01L 29/84 (2006.01)
 H01L 29/66 (2006.01)
 H01L 21/00 (2006.01)
 H01L 21/338 (2006.01)
 H01L 21/336 (2006.01)

(52) U.S. Cl.
 USPC ........... 257/254; 257/331; 257/365; 257/415; 438/52; 438/53; 438/176; 438/283; 977/724; 977/732; 977/733

(58) Field of Classification Search
 USPC .......................................... 977/724, 732, 733
 See application file for complete search history.

(56) References Cited

U.S. PATENT DOCUMENTS

| 7,259,425 | B2 * | 8/2007 | An et al. ........................ 257/341 |
| 2010/0090302 | A1 * | 4/2010 | Nguyen Hoang et al. .... 257/428 |
| 2011/0051535 | A1 * | 3/2011 | Song et al. ............... 365/189.16 |

OTHER PUBLICATIONS

Abele, N. et al, "1T MEMS Memory Based on Suspended Gate MOSFET", IEEE, 2006, pp. 1-4.
Akarvardar, Kerem "Ulralow Voltage Crossbar Nonvolatile Memory Based on Energy-Reversible NEM Switches", IEEE Electron Device Letters, vol. 30, No. 6, Jun. 2009, pp. 626-628.
Choi, W. et al. "Compact Nano-Electro-Mechanical Non-Volatile Memory (NEMory) for 3D Integration", IEEE, 2007, pp. 603-606.
Han, J. et al. "Monolithic Intergration of NEMS-CMOS with a Fin Flip-flop Actuated Channel Transistor.(FinFACT)", IEEE, 2009, pp. 1-4.
Jang, W. et al. "Mechanically Operated Random Access Memory (MORAM) Based on an Electrostatic Microswitch for Nonvolatile Memory Applications", IEEE Transactions on Electron Devices, vol. 55, No. 10, Oct. 2008, pp. 2785-2789.
Kam, H. et al. "A New Nano-Electro-Mechanical Field Effect Transistor (NEMFET) Design for Low-Power Electronics", IEEE, 2005, pp. 1-4.

* cited by examiner

Primary Examiner — Michael Jung
(74) Attorney, Agent, or Firm — Ditthavong Mori & Steiner, P.C.

(57) ABSTRACT

Semiconductor devices are formed with a nano-electro-mechanical system (NEMS) logic or memory on a bulk substrate. Embodiments include forming source/drain regions directly on a bulk substrate, forming a fin connecting the source/drain regions, forming two gates, one on each side of the fin, the two gates being insulated from the bulk substrate, and forming a substrate gate in the bulk substrate. The fin is separated from each of the two gates and the substrate gate with an air gap.

21 Claims, 14 Drawing Sheets

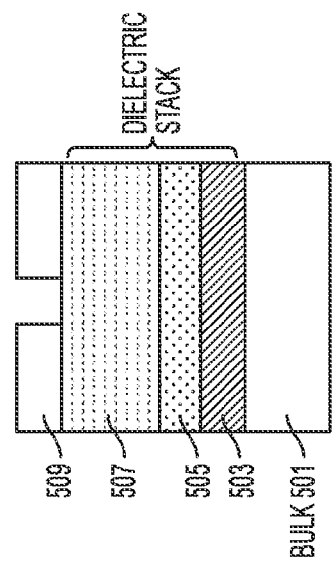
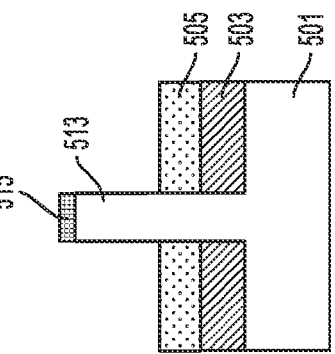
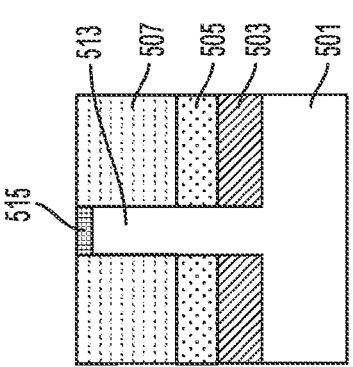
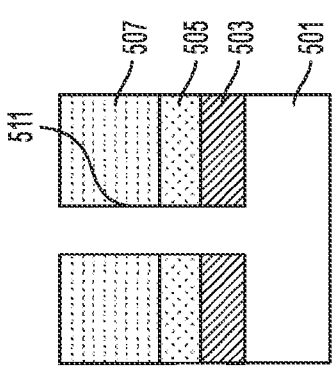
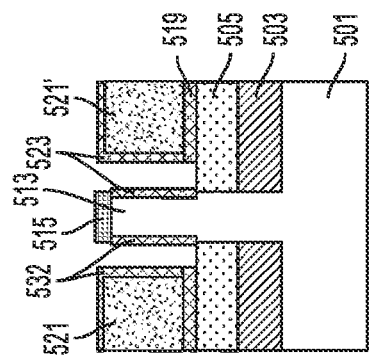
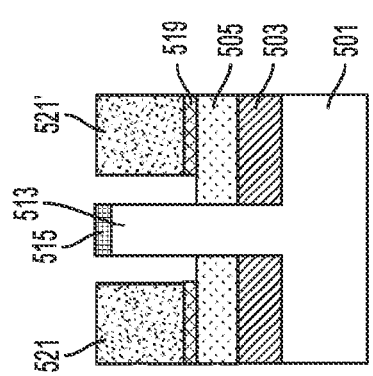
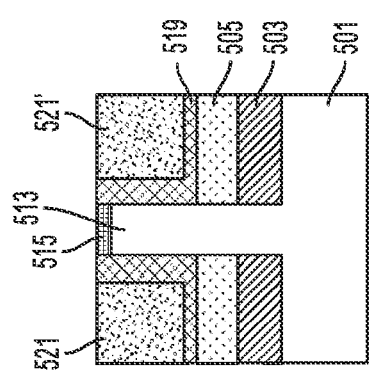

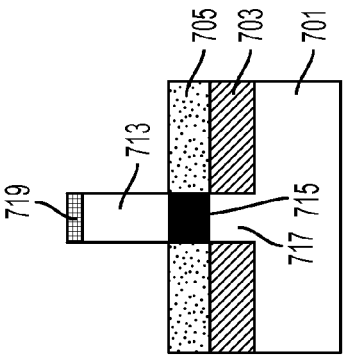
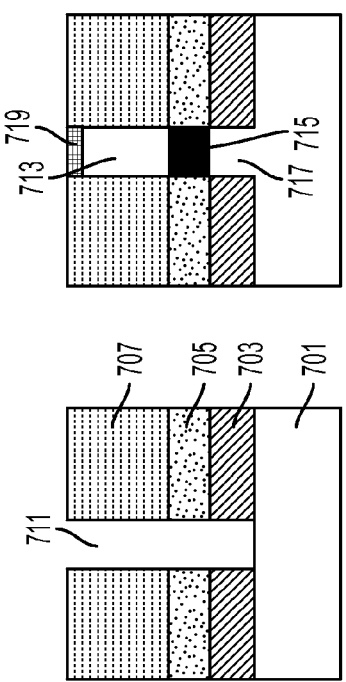
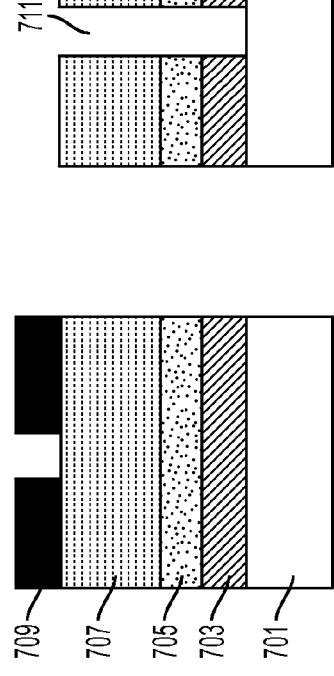
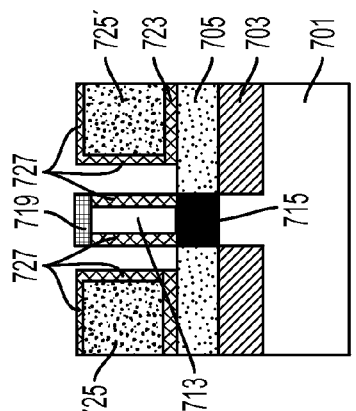
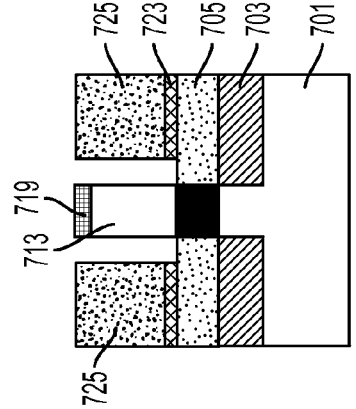
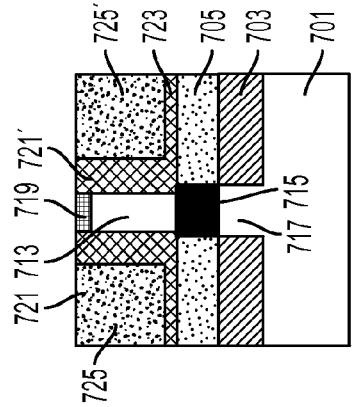
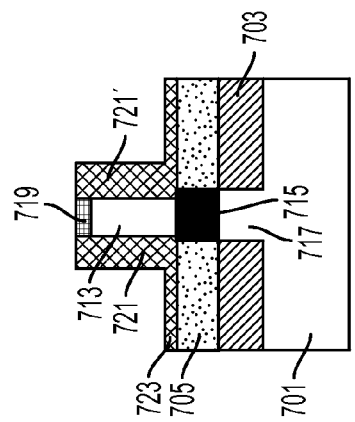

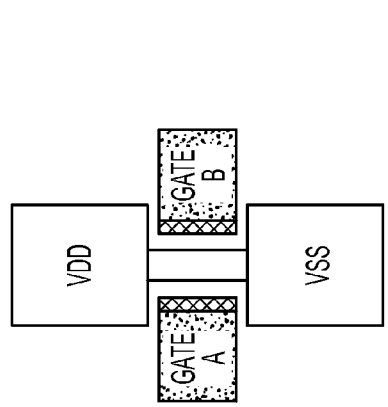

| State | Fig. | Vpgm | Vread | Iread |
|---|---|---|---|---|
| 00 | 11A | VA=Vpgm<br>VB=Vpgm<br>VC=Voff | VA=Va<br>VB=Vb<br>VC=Vc | Io |
| 01 | 11B | VA=Vpgm<br>VB=Voff<br>VC=Voff | VA=Va<br>VB=Vb<br>VC=Vc | Ia |
| 10 | 11C | VA=Voff<br>VB=Vpgm<br>VC=Voff | VA=Va<br>VB=Vb<br>VC=Vc | Ib |
| 11 | 11D | VA=Voff<br>VB=Voff<br>VC=Vpgm | VA=Va<br>VB=Vb<br>VC=Vc | Ic |

US 8,502,279 B2

NANO-ELECTRO-MECHANICAL SYSTEM (NEMS) STRUCTURES WITH ACTUATABLE SEMICONDUCTOR FIN ON BULK SUBSTRATES

TECHNICAL FIELD

The present disclosure relates to nano-electro-mechanical systems (NEMS) in semiconductor devices, and to a method for manufacturing the semiconductor devices with a tri-gate structure. The present disclosure is particularly applicable to manufacturing integrated circuits including CMOS and NEMS on a bulk substrate in a single chip having submicron design features.

BACKGROUND

Nano-Electro-Mechanical Systems (NEMS) integrating electrical and mechanical functionalities on the nanoscale have a wide range of applications, such as automotive, industrial, telecommunication, consumer, medical, aerospace and defense. There is a demand to integrate separate chips with different functionalities (e.g., logic, memory, RF/Optical, NEMS) into a single chip with better performance and lower cost. Since NEMS logic and memory have low power consumption, it is desirable to fabricate NEMS logic and memory on the same chip and even co-integrated with CMOS logic and memory.

FIG. 1 schematically illustrates a conventional semiconductor structure, having a NEMS memory core 101 integrated with a CMOS peripheral circuit 103 on a substrate 105. NEMS memory core 101 is a Fin Flip-flop actuated channel transistor (FinFACT) and CMOS peripheral circuit 103 is an independent-gate (IG) FinFET, with their respective sources 107 and 111 and respective drains 109 and 113 insulated from the substrate 105 by an insulating (e.g., buried oxide) layer 115.

FIG. 2A shows a cross-sectional view taken in the gate-to-gate direction, and FIG. 2B shows a top view, of the semiconductor structure of FIG. 1. In NEMS memory core 101, air gaps 203 exist between fin 205 and two independent gates 207, 207', allowing fin 205 to move from one gate to another gate via electrostatic force. An air gap 209 also exists between fin 205 and insulating (e.g., BOX) layer 115, and optionally substrate 105.

The mechanical operation states of the FinFACT (i.e., NEMS memory core 101) are depicted in FIG. 2C. In an initial state, no electrostatic force (e.g., bias voltage) is applied to gates G1, G2. An electrostatic force is used to write '1' or '0' into the FinFACT by applying different biases Vg1, Vg2 to the two gates G1, G2. In a pull-up state (bit '1'), fin 205 is attracted to the driving gate (e.g., G1). In a pull-down state (bit '0'), fin 205 is attracted to the other gate (e.g., G2).

For a read operation, G1 is used as the driving gate to detect a current flowing from a source 107 to a drain 109. When at bit '1', increasing Vg1 causes a significant current to flow through the source 107 and the drain 109. While at bit '0', increasing Vg1 has no significant impact on the current flowing from source 107 to drain 109.

This conventional structure has a few drawbacks. The silicon-on-insulator (SOI) substrate costs substantially more to manufacture than a bulk substrate. In addition, the FinFET and the FinFACT on SOI suffer from a self-heating effect that degrades the FinFET and induces thermal stress to the FinFACT. The fin breaks easily due to the thermal stress, thereby rendering the FinFACT inoperable.

A need therefore exists for methodology for forming a semiconductor structure with a NEMS on a bulk substrate, with reduced production cost, reduced self-heating effects, and the resulting device.

SUMMARY

An aspect of the present disclosure is a method of forming NEMS logic and/or memory on a bulk substrate.

Another aspect of the present disclosure is a device having NEMS logic and/or memory on a bulk substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming source/drain regions directly on a bulk substrate, forming a fin connecting the source/drain regions, forming two gates, one on each side of the fin, the two gates being insulated from the bulk substrate, and forming a substrate gate in the bulk substrate. The fin is separated from each of the two gates and the substrate gate with an air gap.

Aspects of the present disclosure include forming the fin and the two gates by: forming a first dielectric layer on the bulk substrate; forming a second dielectric layer on the first dielectric layer; forming the fin through the first and second dielectric layers and extending above the second dielectric layer; forming one of the gates on each side of the fin and separated therefrom; forming a third dielectric layer on side walls of the fin and each of the two gates; removing a portion of the second dielectric layer adjacent to the fin on each side; and removing a portion of the fin that is substantially coplanar with the second dielectric layer. Another aspect includes forming the fin through the first and second dielectric layers by: forming a fourth dielectric layer on the second dielectric layer; forming a trench in the first, second, and fourth dielectric layers; and forming the fin in the trench. Additional aspects include forming the fin in the trench by: depositing amorphous silicon (a-Si) or selectively epitaxially growing Si in the trench. Further aspects include forming the two gates by: removing the fourth dielectric layer subsequent to forming the fin; forming spacers on each side of the fin and a fifth dielectric layer on the second dielectric layer; and forming the two gates on the fifth dielectric layer. Other aspects include removing the spacers on each side of the fin, subsequent to forming the two gates, but prior to forming the third dielectric layer. Another aspect includes forming a sixth dielectric layer on a bottom surface of the fin and on a top surface of the substrate gate subsequent to removing the portion of the fin.

Aspects of the present disclosure include forming the fin in the trench by: depositing in the trench a first Si layer to substantially the same thickness as the first dielectric layer, a SiGe layer to substantially the same thickness as the second dielectric layer, and a second Si layer to substantially the same thickness as the fourth dielectric layer. Further aspects include forming the two gates by: removing the fourth dielectric layer subsequent to forming the fin; forming spacers on each side of the fin and a fifth dielectric layer on the second dielectric layer; and forming the two gates on the fifth dielectric layer. Additional aspects include removing the spacers on each side of the fin, subsequent to forming the two gates, but prior to forming the third dielectric layer. Other aspects include removing a portion of the fin by removing the SiGe layer of the fin, and forming a sixth dielectric layer on a bottom surface of the fin and a top surface of the substrate gate subsequent to removing the SiGe layer.

Aspects of the present disclosure include forming the fin and the two gates by: removing portions of the bulk substrate to form a fin; forming a first dielectric layer on each side of the fin; removing a top portion of the first dielectric layer thereby exposing a top portion of the fin; forming one of the gates on each side of the fin and separated therefrom; forming a second dielectric layer on the exposed top portion of the fin and side walls of the gates; removing a portion of the first dielectric layer below a bottom surface of each gate and adjacent each side of the fin; and removing a portion of the fin that is substantially coplanar with the second dielectric layer. Further aspects include forming the two gates by: forming spacers on the first dielectric layer, adjacent the exposed top portion of the fin; depositing a gate on the first dielectric layer adjacent the spacers; and removing the spacers. Another aspect includes forming a third dielectric layer on a bottom surface of the fin and on the top surface of the substrate gate subsequent to removing the portion of the fin.

Another aspect of the present disclosure is a device including: a bulk substrate; source/drain regions directly on the bulk substrate; a fin connecting the source/drain regions; two gates, one on each side of the fin, the two gates being insulated from the bulk substrate; and a substrate gate in the bulk substrate and below the fin. The fin is separated from each of the two gates and the substrate gate with an air gap.

Aspects include a device including a first dielectric layer on the bulk substrate; a second dielectric layer on the first dielectric layer, two gates being insulated from the bulk substrate through the first and second dielectric layers; a third dielectric layer on side walls of the fin and each of the two gates; and a fourth dielectric layer on a bottom surface of the fin and a top surface of a substrate gate. Further aspects include a device including a fin of amorphous silicon (a-Si) or epitaxial Si, the fin having a width of 10 Å to 1000 Å, and a height of 10 Å to 5000 Å. Another aspect includes a device including a third dielectric layer having a thickness of 10 Å to 1000 Å, a fourth dielectric layer having a thickness of 10 Å to 1000 Å, and an air gap between the two gates and the fin having a width of 50 Å to 1000 Å; and an air gap between the substrate gate and the fin having a thickness of 50 Å to 1000 Å. Another aspect includes a device including a first dielectric layer on the bulk substrate, the two gates being insulated from the bulk substrate through the first dielectric layer; a second dielectric layer on side walls of the fin and each of the two gates; and a third dielectric layer on a bottom surface of the fin and a top surface of the substrate gate. Additional aspects include a device including an air gap between a substrate and a fin, the air gap having a trapezoidal cross-section, the bottom surface of which is coplanar with the top surface of a substrate gate.

Another aspect of the present disclosure is a method including: forming source/drain regions directly on a bulk substrate; forming a first oxide layer on the bulk substrate; forming a nitride layer on the first oxide layer; forming a second oxide layer on the nitride layer; forming a trench in the first oxide, nitride, and second oxide layers; doping the substrate through the trench to form a substrate gate in the bulk substrate; depositing amorphous silicon (a-Si) or selectively epitaxially growing Si in the trench to form a fin, the fin connecting the source/drain regions; removing the second oxide layer; forming spacers on each side of the fin and a first dielectric layer on the nitride dielectric layer; and forming two gates on the first dielectric layer, one on each side of the fin and separated therefrom, the two gates being insulated from the bulk substrate; removing the spacers on each side of the fin; forming a second dielectric layer on side walls of the fin and each of the two gates; removing a portion of the nitride layer adjacent to the fin on each side; and removing a portion of the fin that is substantially coplanar with the nitride layer, wherein the fin is separated from each of the two gates and the substrate gate with an air gap.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 5A through 5K schematically illustrate a process flow for forming a NEMS structure on a single chip, in accordance with an exemplary embodiment;

FIGS. 7A through 7K schematically illustrate a process flow for forming a NEMS structure on a single chip, in accordance with another exemplary embodiment;

FIGS. 8A through 8D and 9A through 9D schematically illustrate top and side views, respectively, of mechanical operation states of a NEMS structure for actuating with a Tri-Gate Fin, according to an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of thermal stress and increased attendant upon forming NEMS structures on a SOI substrate. In accordance with embodiments of the present disclosure, a bulk silicon substrate is employed, thereby reducing manufacturing costs. Further, by including an air gap between the gates and the substrate, heat may be dissipated, thereby reducing fin breakage and increasing operability.

Methodology in accordance with embodiments of the present disclosure includes forming source/drain regions directly on a bulk substrate, forming a fin connecting the source/drain regions, forming two gates, one on each side of the fin, the two gates being insulated from the bulk substrate, and forming a substrate gate in the bulk substrate. The fin is separated from each of the two gates and the substrate gate with an air gap.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3:
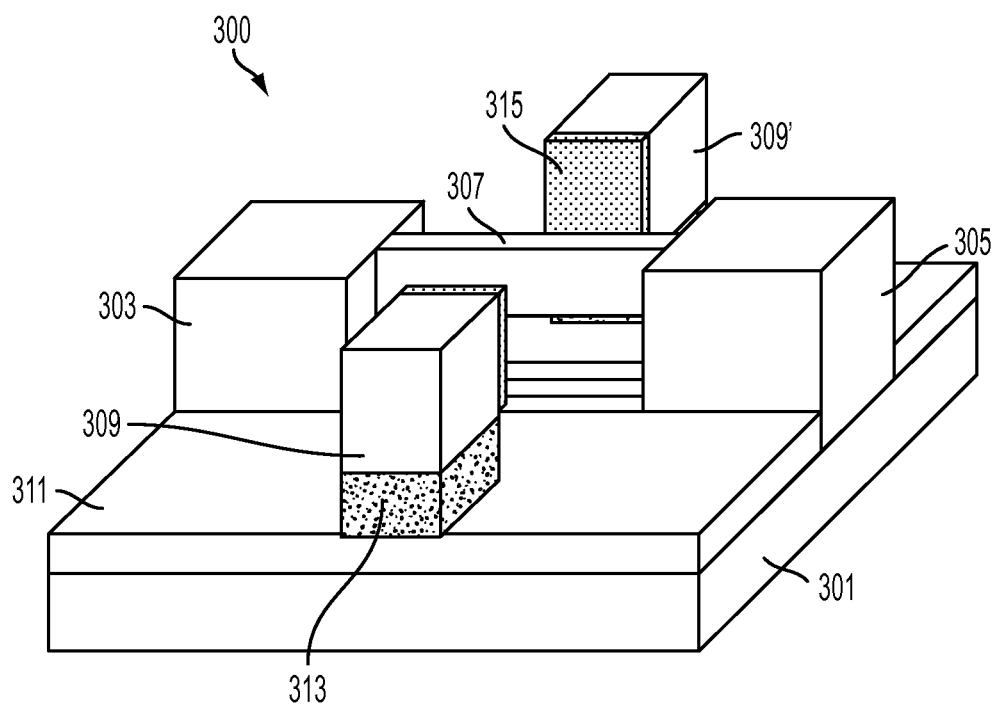
FIG. 3 schematically illustrates a semiconductor structure including a NEMS formed on a bulk substrate, in accordance with an exemplary embodiment.

Adverting to FIG. 3, in accordance with an exemplary embodiment, a semiconductor structure including a NEMS 300 is formed on a bulk substrate 301. Bulk substrate 301 is cheaper to produce than SOI. A source 303 and a drain 305 are directly connected with substrate 301 to increase heat dissipation, reducing thermal stress to a fin 307, thus improving reliability of NEMS 300. Fin 307 floats above bulk substrate 301 and connects source 303 and drain 305. Two gate electrodes 309 and 309' are formed on top of a dielectric stack including dielectric layers 311 and 313, which may be formed of the same material or of different materials. Gate electrodes 309 and 309' are separated from floating fin 307 by air gaps. In addition, a dielectric layer 315 is formed on a side surface of gate electrodes 309 and 309' facing fin 307. By biasing the gates differently, an electrostatic force is generated to pull fin 307 towards one of the independent gates 309 and 309'. This would represent either bit '1' or bit '0'. Thus, it could be used as a memory or logic.

Figure 4:
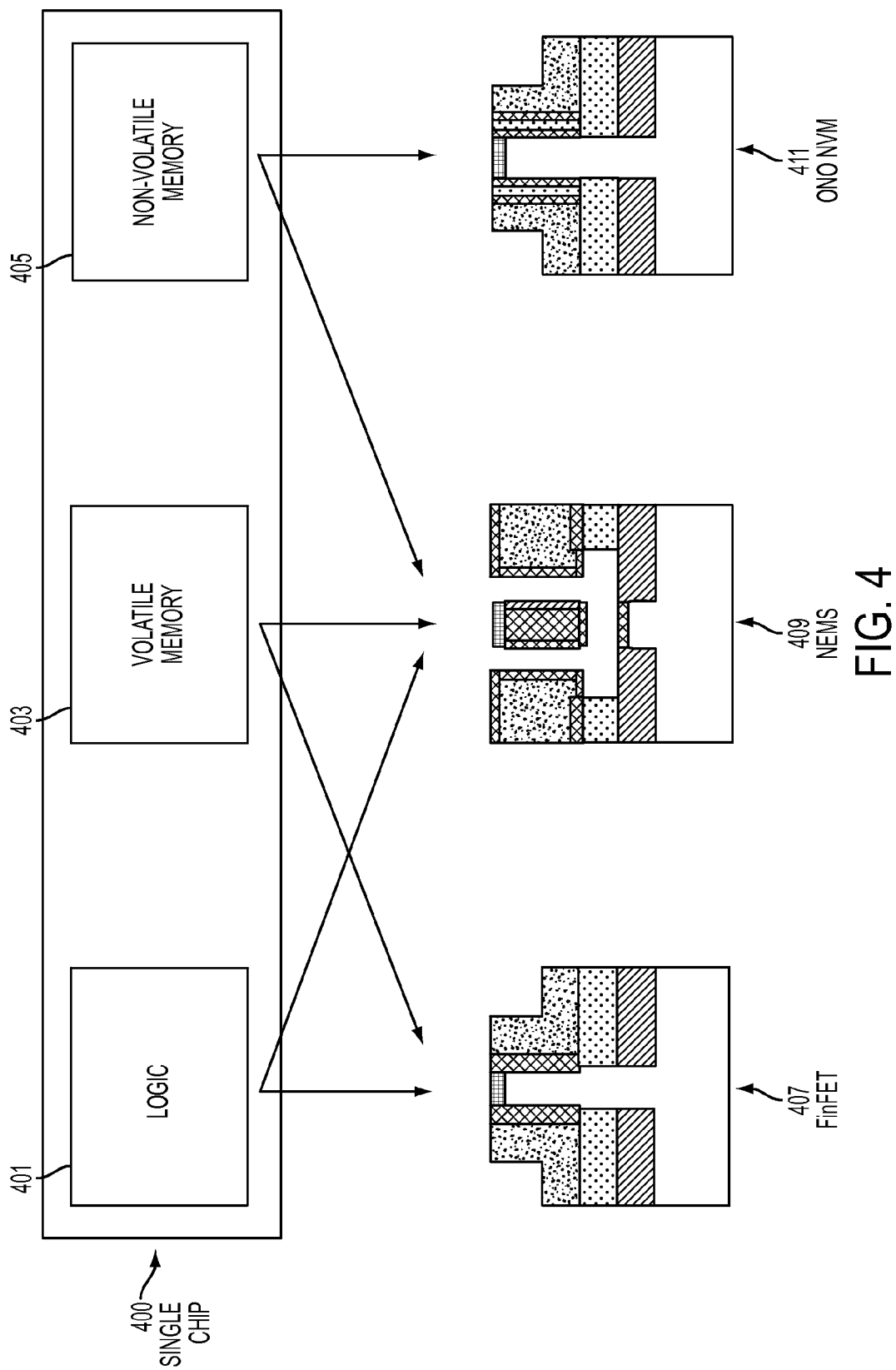
FIG. 4 illustrates the convergence of various technologies or applications in one single chip, according to various embodiments.

FIG. 4 illustrates the convergence of various technologies or applications in a single chip, according to an exemplary embodiment. The single chip 400 may include at least one of logic device 401, volatile memory 403 (e.g., SRAM, DRAM, ZRAM, etc.), and non-volatile memory (NVM) 405 (e.g., silicon/oxide/nitride/oxide/silicon, "SONOS"). Each of the logic device 401, volatile memory 403, and NVM 405 can be formed from a basic structure including a fin on a bulk substrate, as NEMS 301 shown in FIG. 3.

By way of example, a FinFET 407 and/or a NEMS FinFET may be employed as a logic device in switching circuits. For a volatile memory, a FinFET and/or a NEMS memory 409 may be used. A NEMS memory and/or an oxide/nitride/oxide (ONO) NVM 411 may be utilized in a non-volatile memory.

The manufacturing processes of a NEMS memory 409 in accordance with exemplary embodiments are discussed later. These processes can be modified to form FinFET 407 and ONO NVM 411 for different applications.

FIGS. 5A through 5K schematically illustrate a process flow for forming a NEMS structure on a single chip, in accordance with an exemplary embodiment. In one embodiment, the single chip (such as that shown in FIG. 4) includes the NEMS structure of FIG. 3. In other embodiments, the single chip includes additional logic and/or memory devices (e.g., a CMOS bulk device) formed concurrently with the NEMS structure.

As illustrated in FIG. 5A, a triple layer dielectric stack is deposited on a bulk substrate 501 instead of SOI. For example, the triple layer dielectric stack includes an oxide layer 503, a nitride (N) layer 505, and another oxide layer 507. Well isolation and substrate gate implantation may be performed before, during, or after dielectric stack deposition. A photo-resist (PR) is formed and patterned on oxide layer 507 to form a trench pattern 509.

A dry etching process is applied to the triple layer dielectric stack via pattern 509 to create a trench 511, as illustrated in FIG. 5B. Etching may, for example, be chemical, plasma, physical (ion milling), or reactive ion etching. For example, the structure is exposed to a bombardment of ions (e.g., a plasma of reactive gases such as fluorocarbons, oxygen, chlorine, boron trichloride; sometimes with addition of nitrogen, argon, helium and other gases, operating between 0.1 and 5 Torr).

Adverting to FIG. 5C, amorphous silicon (a-Si) may be deposited or Si may be selectively epitaxially grown (SEG) in trench 511, to provide a fin 513. After chemical mechanical polishing (CMP) the Si surface, a hard mask 515 is formed by oxidation of Si, or N or titanium nitride (TiN) deposition, followed by CMP. Fin 513 may be undoped or doped with p-type (e.g., boron (B)) or n-type dopant (e.g., arsenic (As)) having a concentration of 1e15 to 1e19 cm-3, by implantation or by in situ doping during the selective epitaxial growth. Top dielectric layer 507 is then selectively removed, defining the fin height, as illustrated in FIG. 5D.

Dielectric spacers 517 and 517' are formed on the sides of fin 513, and another dielectric layer 519 is formed on second dielectric layer 505, as illustrated in FIG. 5E. The spacers may be formed of oxide, and have a thickness of 50 Å to 1000 Å. Dielectric layer 519 may be formed to the same thickness for both a CMOS structure and the NEMS structure. Alternatively, dielectric layers of different thicknesses may be formed in the CMOS and NEMS structures. For example, thin dielectric layers may be formed in CMOS structures, while thick dielectric layers may be formed in NEMS structures.

Adverting to FIG. 5F, two gate electrodes 521 and 521' are formed on dielectric layer 519. For example, a gate electrode material, e.g., TiN or tantalum nitride (TaN) is deposited, CMP is performed, and the gate electrode material is patterned and etched. Spacers 517 and 517' are then removed from the sidewalls of fin 513 and source/drain regions (not shown for illustrative convenience), as illustrated in FIG. 5G. Implantation and annealing may then be carried out for source/drain regions. Alternatively, this may be performed before spacer removal.

With the CMOS structure shielded, for example with a photo-resist (PR), a thin protective dielectric layer 523 is formed on the sidewalls of fin 513 and on sidewalls of gate electrodes 521 and 521', as illustrated in FIG. 5H. The thin protective dielectric layer 523 may be formed by oxidation or by deposition followed by dry etching. The thin protective dielectric layer 523 may be formed of oxide, to a thickness of 50 Å to 100 Å.

Figure 5K:
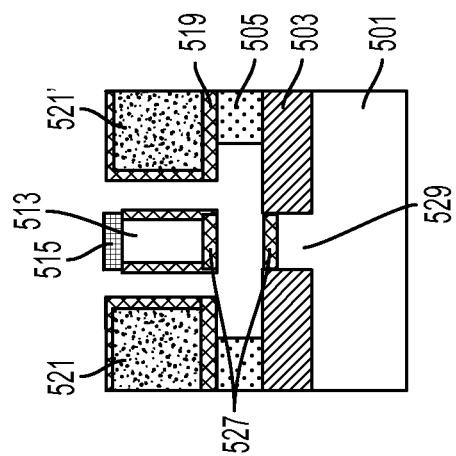
Figure 5J:
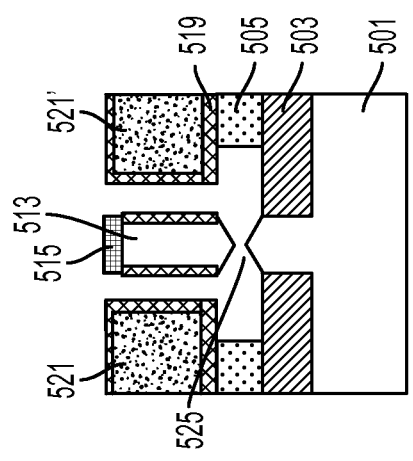
Figure 5I:
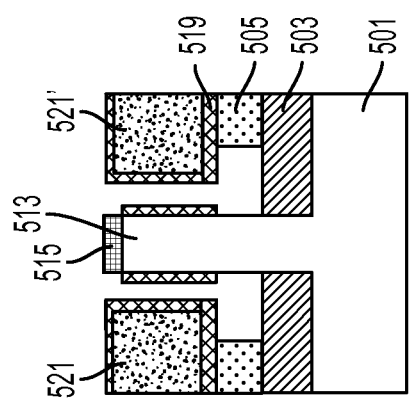

A portion of dielectric layer 505 adjacent to fin 513 is then removed by etching (e.g., wet etching), as illustrated in FIG. 5I. The portion may extend 100 Å to 5000 Å under gates 521 and 521'. To make fin 513 float, an isotropic etch is carried out to remove a portion 525 of fin 513, as illustrated in FIG. 5J. Fin 513, made of a-Si or Si, may be etched by wet etching using tetramethylammonium hydroxide (TMAH)/potassium hydroxide (KOH), sodium hydroxide (NaOH), or 1,6-bis(trimethoxysilyl)hexane (BTMH), or by dry etching using xenon difluoride ($XeF_2$) or sulfur difluoride ($SF_6$). The removed portion 525 of fin 513 is substantially coplanar with dielectric layer 505.

If fin 513 is still connected to the substrate 501, another round of oxidation, wet etching (removing unwanted oxide), and annealing (for rounding) are performed to isolate fin 513 from substrate 501, as illustrated in FIG. 5K. A dielectric layer 527 is then formed on a bottom surface of fin 513 and a top surface of a substrate gate 529, as illustrated in FIG. 5K. Dielectric layer 527 may contain oxide or nitride, and has a thickness of 10 Å to 100 Å. In this embodiment, fin 513 in FIG. 5K has a width of 10 Å to 1000 Å and a height of 10 Å to 5000 Å. Alternatively, after annealing a wet etch may be used to remove hard mask 515 and dielectric layer 523 around the fin and gates, followed by forming dielectric layer 527 all over the fin, substrate, and gates.

Substrate gate 529 may be formed before, during, or after dielectric stack deposition, as earlier discussed in conjunction with FIG. 5A. Substrate gate 529 may be formed by implanting ions of n-type (e.g., As) or p-type (e.g., B) with energies in the range of 5 keV to 100 keV to provide a penetration depth ("range" or "thickness") of 10 Å to 1000 Å. There may be multiple implants. A well isolation process for forming the CMOS bulk device can be conducted concurrently with the process of forming substrate gate 529.

This method of forming fin 513 provides good controllability of the fin height by selectively removing dielectric layer 507, thereby reducing the variability of the fin height. In addition, fin 513 floats above substrate 501 as supported by the source and the drain connecting the bulk substrate for better heat dissipation. It is noted that each of the source/drain regions has a large area contacting bulk substrate 501, as shown in FIG. 3.

FIGS. 6A through 6K schematically illustrate a process flow for forming a NEMS structure on a single chip, in accordance with another exemplary embodiment. The single chip (such as that shown in FIG. 4) may include a NEMS structure or may include additional logic and/or memory devices (e.g., a CMOS bulk device) formed concurrently with the NEMS structure.

Figure 6A:
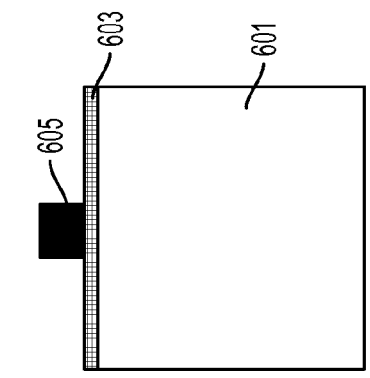
FIGS. 6A through 6K schematically illustrate a process flow for forming a NEMS structure on a single chip, in accordance with another exemplary embodiment.

As illustrated in FIG. 6A, a hard mask layer 603 is formed on a bulk substrate 601, instead of an SOI substrate. A photoresist (PR) is then formed on substrate 601 and patterned to form a pattern 605.

Figure 6B:
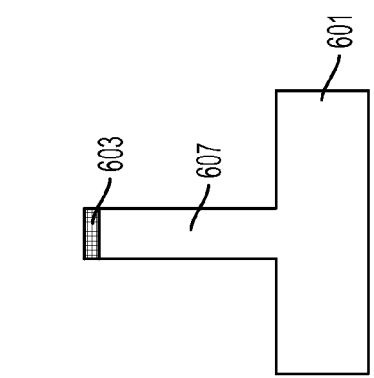
Figure 6C:
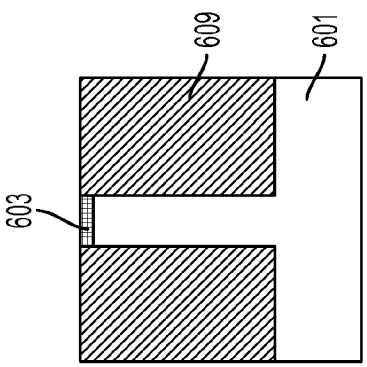

An etching process (e.g., dry etching) is applied to substrate 601 through pattern 605 to create a fin 607, as illustrated in FIG. 6B. Fin 607 may be formed to a height of 100 Å to 5000 Å. A dielectric layer 609 is then formed on each side of fin 607 by dielectric deposition (e.g. oxide) and CMP, as illustrated in FIG. 6C.

Figure 6D:
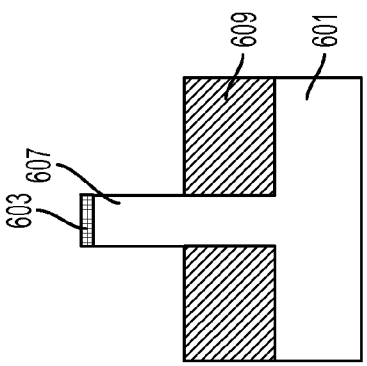

Adverting to FIG. 6D, a top portion of dielectric layer 609 is removed (e.g., by etching), thereby exposing a top portion of the fin that defines the ultimate fin height. Fin 607 may be undoped or doped with p-type (e.g., B) or n-type (e.g., As) to a concentration of 1e15 to 1e19, by implantation. Alternatively, fin implantation may be performed during well-isolation implantation associated with the CMOS structure.

Figure 6E:
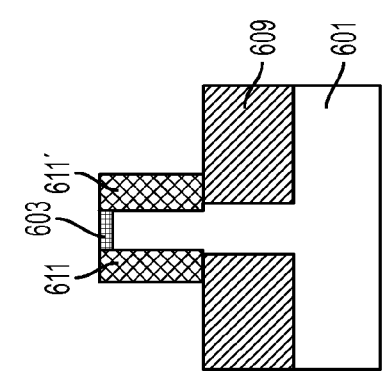

Dielectric spacers 611 and 611' are formed on the sides of fin 607, as illustrated in FIG. 6E. The spacers may be formed of nitride, and have a thickness of 50 Å to 1000 Å. Dielectric spacers may be formed to the same thickness in both a CMOS structure and a NEMS structure. Alternatively, spacers of different thicknesses may be formed in CMOS and NEMS structures. For example, thin spacers may be formed in CMOS structures, while thick spacers may be formed in NEMS structures.

Figure 6F:
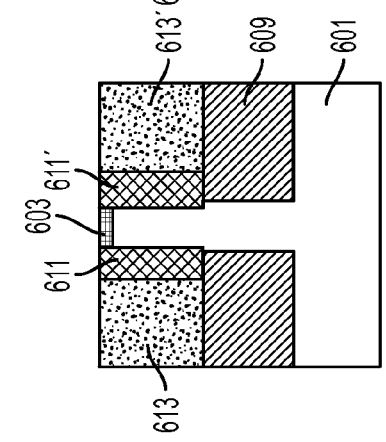
Figure 6G:
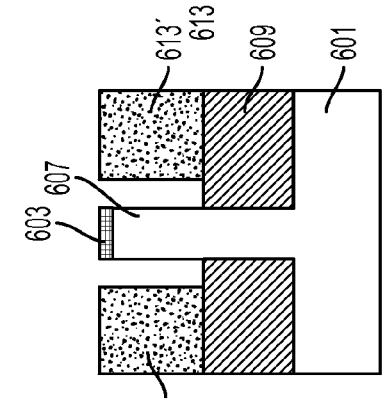

Two gate electrodes 613 and 613' may then be formed, as illustrated in FIG. 6F. A gate electrode material, for example TiN or TaN is deposited, CMP is performed, and the gate electrode material is patterned and etched. With the CMOS structure shielded, spacers 611 and 611' are then removed from the sidewalls of fin 607 of the NEMS, as illustrated in FIG. 6G. Implantation and annealing may be carried out for source/drain regions (not shown for illustrative convenience). Alternatively, this may be carried out before spacer removal.

Figure 6H:
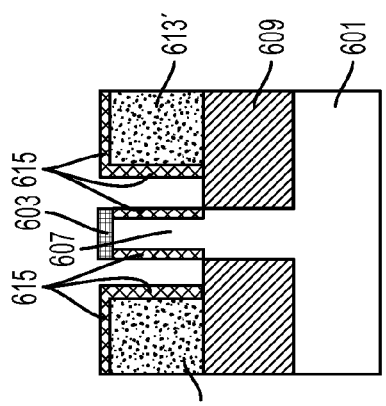

A thin protective dielectric layer 615 is formed on the sidewalls of fin 607 and the sidewalls of the gate electrodes 613 and 613', in place of spacers 611 and 611', as illustrated in FIG. 6H. Thin protective dielectric layer 615 may be formed by oxidation or deposition followed by dry etching of a protective dielectric material, for example a nitride, and may be formed to a thickness of 50 Å to 100 Å.

Figure 6K:
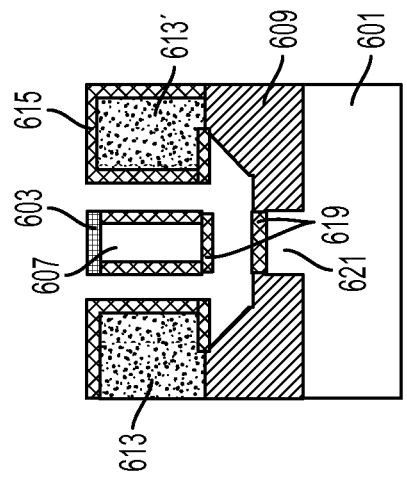
Figure 6J:
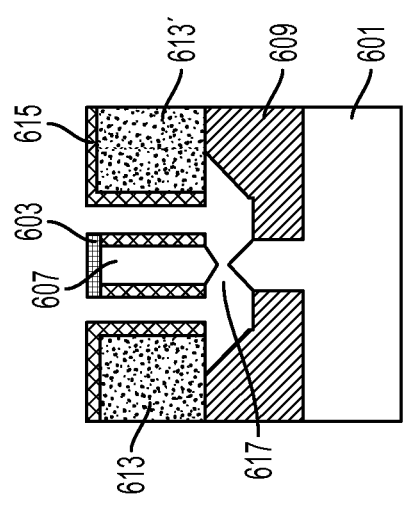
Figure 6I:
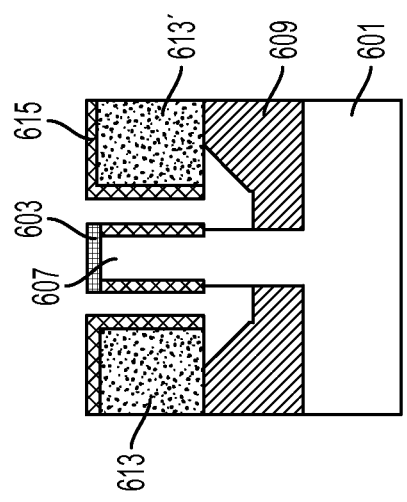

Adverting to FIG. 6I, a portion of dielectric layer 609 adjacent to each side of fin 607 and extending under gate electrodes 613 and 613', respectively, is then removed by etching (e.g., wet etching), forming a cavity with a trapezoidal cross-section.

To make fin 607 float, an isotropic etch is carried out to remove a portion 617 of fin 607, as illustrated in FIG. 6J. Fin 607 of Si may be etched by wet etching using TMAH/KOH, NaOH, or BTMH, or by dry etching using $XeF_2$ or $SF_6$. If fin 607 is still connected to substrate 601, another round of oxidation, wet etching (removing unwanted oxide), and annealing (for rounding) may be performed to isolate fin 607 from substrate 601.

A dielectric layer 619 is then formed on a bottom surface of fin 607 and a top surface of a substrate gate 621 (formed in substrate 601 below fin 607), as illustrated in FIG. 6K. Dielectric layer 619 may contain oxide, and may be formed to a thickness of 10 Å to 100 Å. Fin 607 in FIG. 6K has a width of 10 Å to 1000 Å and a height of 10 Å to 5000 Å. Alternatively, after annealing a wet etch may be used to remove hard mask 603 and dielectric layer 615 around the fin and gates, followed by forming dielectric layer 619 all over the fin, substrate, and gates.

Substrate gate 621 may be formed before, during, or after dielectric stack deposition earlier discussed in conjunction with FIG. 6C. Substrate gate 621 may be formed by implanting ions of n-type (e.g., As) or p-type (e.g., B) with energies in the range of 5 keV to 100 keV to provide a penetration depth of 10 Å to 1000 Å. A well isolation process for forming the CMOS bulk device can be conducted concurrently with the process of forming substrate gate 621.

This method of forming fin 607 provides good controllability of the fin height by selectively removing dielectric layer 609, thereby reducing the variability of the fin height. In addition, fin 607 floats above substrate 601 as supported by the source and the drain connecting the bulk substrate for better heat dissipation. It is noted that each of the source/drain regions has a large area contacting bulk substrate 601, as shown in FIG. 3.

FIGS. 7A through 7K schematically illustrate a process flow for forming a NEMS structure, in accordance with another exemplary embodiment. A single chip (such as that shown in FIG. 4) may include only the NEMS structure of FIG. 3 or may include additional logic and/or memory devices (e.g., a CMOS bulk device) formed concurrently with the NEMS structure. This process resembles the process illustrated in FIGS. 5A through 5K, but includes forming a Si/SiGe/Si stack as the fin in place of a-Si or Si.

Adverting to FIG. 7A, a triple layer dielectric stack is deposited on a bulk substrate 701 instead of SOI. The triple layer dielectric stack includes an oxide layer 703, a nitride layer 705, and another oxide layer 707. Oxide layers 703 and 707 may be formed of the same material or different materials. A substrate gate may be formed in substrate 701 before, during, or after dielectric stack deposition. A well isolation process for forming a CMOS bulk device may be conducted concurrently with the process of forming the substrate gate.

A photo-resist (PR) is then deposited and patterned to form a trench pattern 709. An etching process is applied to the triple layer dielectric stack through the pattern 709 to create a trench 711, as illustrated in FIG. 7B. Etching may, for example, be dry etching, such as chemical, plasma, physical (ion milling), or reactive ion etching.

To form a fin, a Si/SiGe/Si stack is deposited or selectively epitaxially grown (SEG) in trench 711, as illustrated in FIG. 7C. The Si/SiGe/Si stack includes Si layer 713, SiGe layer 715, and another Si layer 717. The three layers in the Si/SiGe/Si stack in FIG. 7C have substantially the same thicknesses as the three dielectric layers of the O/N/O stack in FIG. 7A. A hard mask 719 may then be formed by oxidation of Si, or N or TiN deposition, followed by CMP. Hard mask 719 may be made of SiN. Fin 713 may be doped with p-type (e.g., B) or n-type dopant (e.g., As) to a concentration of 1e15 to 1e19, by implantation or by in situ doping during the selective epitaxial growth. Adverting to FIG. 7D, top dielectric layer 707 is then selectively removed as a defined fin height.

As illustrated in FIG. 7E, dielectric spacers 721 and 721' are formed on the sides of fin 713, and another dielectric layer 723 is formed on second dielectric layer 705. The spacers and dielectric layer 723 may be formed of oxide, and to a thickness of 50 Å to 1000 Å. Dielectric layers 723 may be formed of an identical thickness in a CMOS structure and the NEMS structure, or may alternatively be formed of different thicknesses in CMOS and NEMS structures. For example, thin dielectric layers may be formed in CMOS structures, while thick dielectric layers may be formed in NEMS structures.

Two gate electrodes 725 and 725' may then be formed, as illustrated in FIG. 7F. A gate electrode material, for example TiN or TaN are deposited, CMP is performed, and the gate electrode material is patterned, and etched. With the CMOS structure shielded, spacers 717 and 717' are then removed from the sidewalls of fin 713 of the NEMS, as illustrated in FIG. 7G. Implantation and annealing may be carried out for source/drain regions (not shown for illustrative convenience).

A thin protective dielectric layer 727 is formed on sidewalls of fin 713 and sidewalls of gate electrodes 725 and 725', in place of the spacers 721 and 721', as illustrated in FIG. 7H. Thin protective dielectric layer 727 may be formed by oxidation or deposition followed by dry etching of a protective dielectric material, for example oxide, and may be formed to a thickness of 50 Å to 100 Å.

Figure 7K:
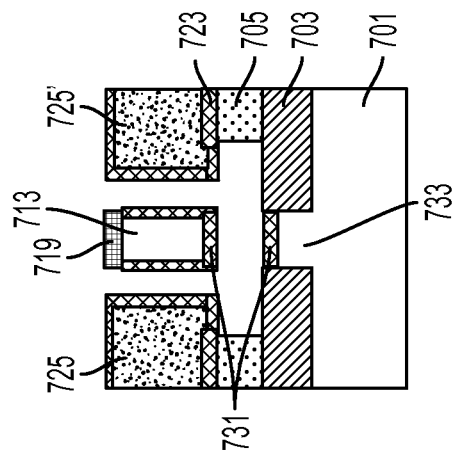
Figure 7J:
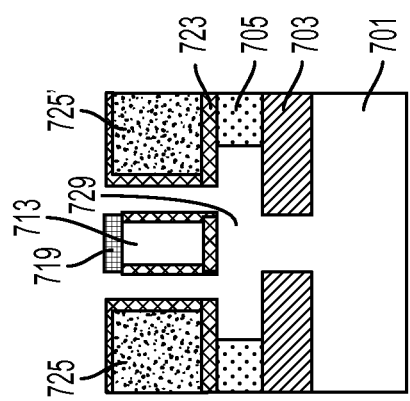
Figure 7I:
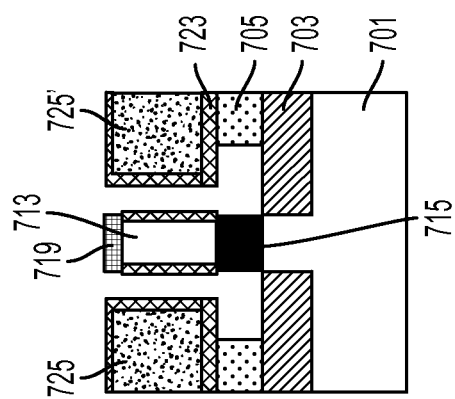

As illustrated in FIG. 7I, a portion of dielectric layer 705 adjacent to each side of fin 713 and extending under gate electrodes 725 and 725', respectively, is then removed by etching (e.g., wet etching), forming a cavity with a trapezoidal cross-section. To make the fin 713 float, an isotropic etch is carried out to remove SiGe layer 715 to provide an air gap 729, as illustrated in FIG. 7J. SiGe layer 715 may be etched by wet etching using buffered hydrogen fluoride (HF), $H_2O_2$, and acetic acid Si, or by dry etching using $XeF_2$ or $SF_6$. Air gap 729 is substantially coplanar with dielectric layer 705. If fin 713 is still connected to substrate 701, further oxidation, wet etching (removing unwanted oxide), and annealing (for rounding) may be performed to isolate fin 713 from substrate 701. Although not shown, the region under the source and drain has a large area and will remain connected to the bulk of the substrate.

Adverting to FIG. 7K, a dielectric layer 731 is then formed on a bottom surface of fin 713 and a top surface of a substrate gate 733. Dielectric layer 731 may contain oxide, and may be formed to a thickness of 10 Å to 1000 Å. Fin 713 in FIG. 7K has a width of 10 Å to 1000 Å and a height of 10 Å to 5000 Å. Alternatively, after annealing a wet etch may be used to remove hard mask 719 and dielectric layer 727 around the fin and gates, followed by forming dielectric layer 731 all over the fin, substrate, and gates.

Substrate gate 733 may be formed before, during, or after dielectric stack deposition earlier discussed in conjunction with FIG. 7A. Substrate gate 733 may be formed by implanting ions of n-type (e.g., As) or p-type (e.g., B) with energies in the range of 5 keV to 100 keV to provide a penetration depth of 10 Å to 1000 Å. There may be multiple implants. A well isolation process for forming the CMOS bulk device can be conducted concurrently with the process of forming substrate gate 733.

This method of forming the fin 713 provides good controllability of the fin height by selectively removing dielectric layer 707, thereby reducing the variability of the fin height. In addition, fin 713 floats above substrate 701 as supported by the source and the drain connecting the bulk substrate for better heat dissipation. It is noted that each of the source/drain regions has a large area contacting the bulk substrate 701 as shown in FIG. 3.

Figure 1:
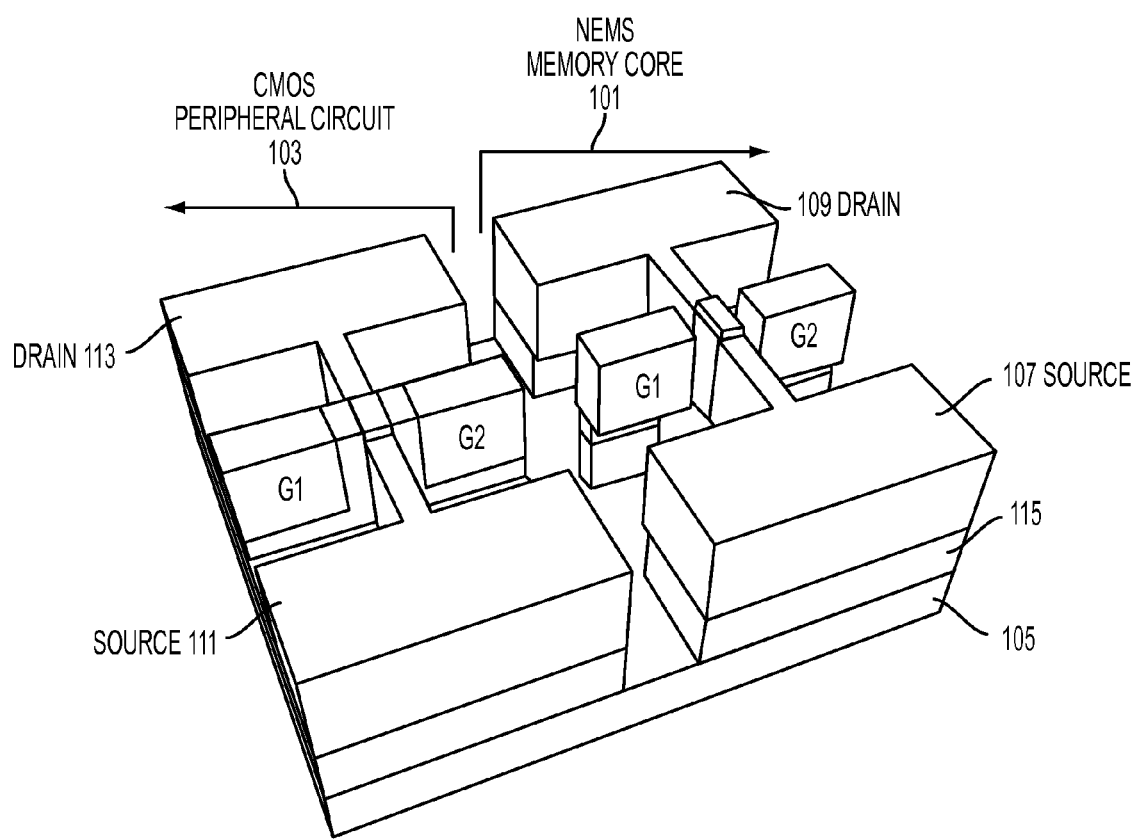
FIG. 1 schematically illustrates a conventional semiconductor device.
Figure 2A:
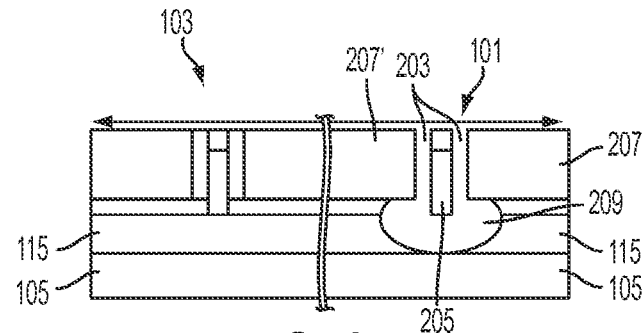
FIGS. 2A and 2B schematically illustrate a cross-sectional view, taken along the gate-to-gate direction and a top view, respectively, of the semiconductor device of FIG. 1, and FIG. 2C schematically illustrates the mechanical operation states of the FINFact illustrated in FIG. 1.
Figure 2B:
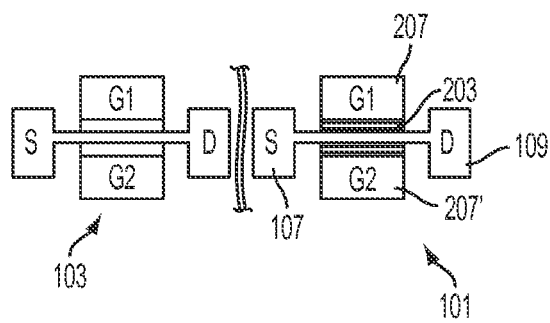
Figure 2C:
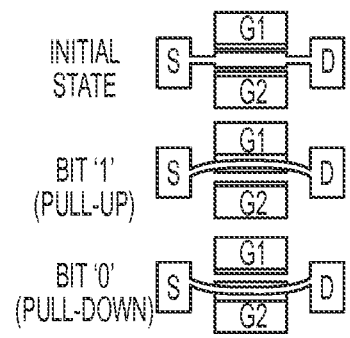

FIGS. 8A through 8D and 9A through 9D schematically illustrate top and side views, respectively, of mechanical operation states of a NEMS structure for actuating with a Tri-Gate Fin, in accordance with exemplary embodiments. By biasing gates A, B, and C differently, an electrostatic force may be generated to pull the fin towards one of the gates. In the FIGS. 8A and 9A, the fin is actuated in a neutral position without contacting the gates. In FIGS. 8B and 9B, the fin is actuated to contact Gate A. In FIGS. 8C and 9C, the fin is actuated to contact Gate B. In FIGS. 8D and 9D, the fin is actuated to contact Gate C. There are only two independent gates (Gates A & B) for the fin actuation in the conventional NEMS structure formed on the SOI substrate as shown in FIGS. 2A through 2C. On the other hand, the exemplary embodiments illustrated in FIGS. 3 through 7 have a third/substrate gate formed on a bulk substrate to actuate the associated state according to FIGS. 8D and 9D. By doping the substrate as the third gate (Gate C), the fin may be actuated with three gates to provide more operation flexibility.

Figure 10D:
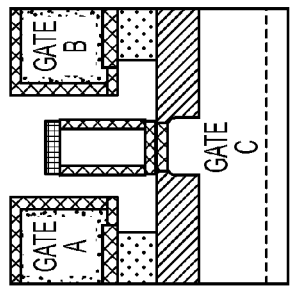
FIGS. 10A through 10D schematically illustrate mechanical operation states of a NEMS structure for modulating a current flowing between the source and drain, according to an exemplary embodiment.
Figure 10C:
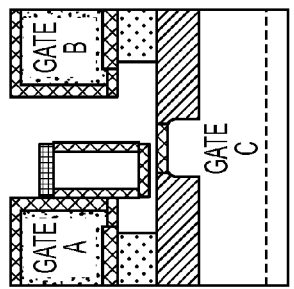
Figure 10B:
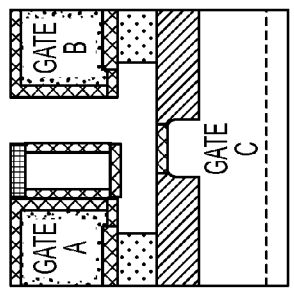
Figure 10A:
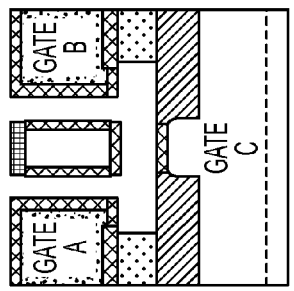
Figure 11D:
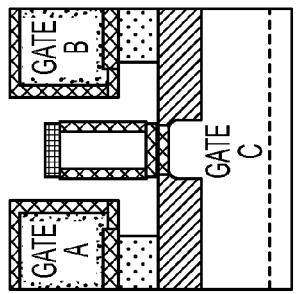
FIGS. 11A through 11D schematically illustrate mechanical operation states of a NEMS structure as a multi-level memory, according to an exemplary embodiment.
Figure 11C:
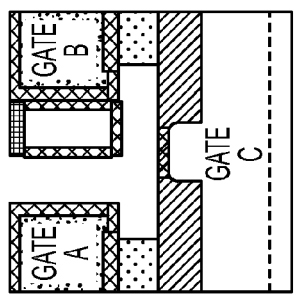
Figure 11B:
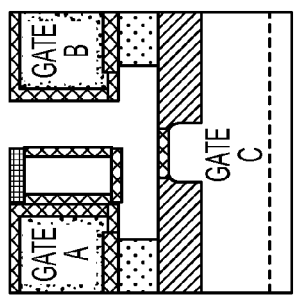
Figure 11A:
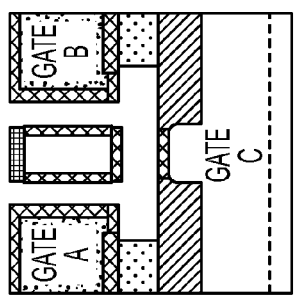

FIGS. 10A through 10D schematically illustrate mechanical operation states of a NEMS structure for modulating a current flowing between the source and drain, in accordance with exemplary embodiments. In FIG. 10A, the fin is actuated in an initiate state without contacting the gates. In FIG. 10B, the fin is actuated to fully contact either Gate A or Gate B (e.g., Gate A) to conduct a high current between the source and the drain. In FIG. 10C, the fin is actuated to partially contact Gate A or Gate B (e.g., Gate A) without contacting Gate C to conduct a low current between the source and the drain. In FIG. 10, the fin is actuated to contact Gate C to inhibit current between the source and the drain. The FIG. 10D state may be used as an off-state.

The tri-gate NEMS uses Gate C to modulate the current of the device. Without applying bias to Gate C, the fin is actuated by Gate A and in full contact therewith, thereby resulting in a high current. When applying a bias to Gate C, the fin is actuated by Gate C such that it will only be in partial contact with Gate A, and current flowing through the fin is modulated. When the fin contacts Gate C, Gate A and Gate B are inhibited from influencing the current. Therefore, the tri-gate NEMS structures of FIGS. 3 through 7 can be modulated to control a current flowing between the source and drain, as illustrated in FIGS. 10 through 10D.

FIGS. 11A through 11D schematically illustrate mechanical operation states of a NEMS structure as a multi-level memory, in accordance with exemplary embodiments. In contrast with the conventional 1-bit operation discussed in conjunction with FIGS. 2A through 2C, the tri-gate NEMS structures of FIGS. 3 through 7 can operate as a 2-bit memory cell. By biasing gates A, B, and C differently, an electrostatic force may be generated to pull the fin towards one of the gates. In the first state (FIG. 11A), the fin is actuated in a neutral position without contacting the gates. In the second state (FIG. 11B), the fin is actuated to contact Gate A. In the third state (FIG. 11C), the fin is actuated to contact Gate B. In the fourth state (FIG. 11D), the fin is actuated to contact Gate C. The four states in FIGS. 11A through 11D mirror the four states in FIGS. 8A through 8D and 9A through 9D.

Figures 12A, 12B:
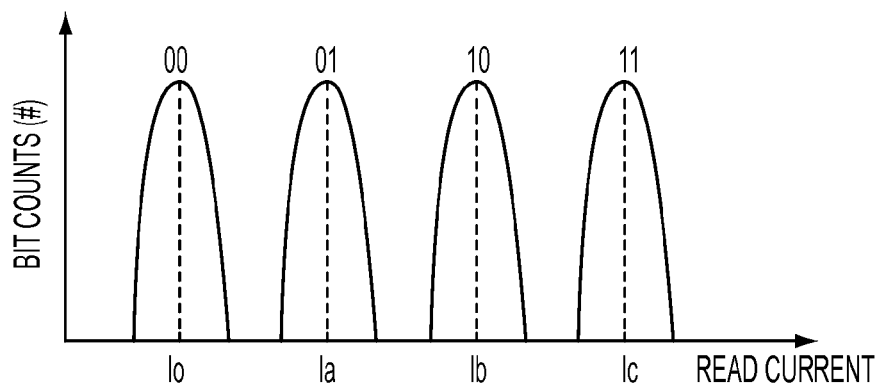
FIGS. 12A and 12B schematically illustrate different bit counts and respective read current verification levels of the multi-level memory of FIGS. 11A through 11D, according to an exemplary embodiment.

FIG. 12A schematically illustrates different bit counts and respective read current verification levels of the multi-level NEMS memory of FIGS. 11A through 11D, in accordance with exemplary embodiments. The fin has 4 states to be programmed as 00, 01, 10, and 11 by applying different programming bias to different gates. FIG. 12B schematically illustrates a table corresponding different memory states programming bias, read bias, and respective read current verification levels of the multi-level NEMS memory, in accordance with exemplary embodiments. To be in state 00, Gate A and Gate B are biased to Vpgm with Gate C being biased at Voff. The gate bias results in a free/floating fin. To move the fin to either one of the three gates, the gate of contact is biased at Vpgm while the other two gates are biased at Voff. Once the fin is biased to contact one gate, the fin will attach to the gate by an adhesion force.

To read a memory state of the cell, the three gates are biased at different values (e.g., Va=0.2 V, Vb=0.4V, Vc=0.6V). The read voltages are sufficiently low (e.g., 0 to 2V, though the voltage depends on design) to avoid actuating the fin to contact any of the gates. The read current, when in contact with different gates at different biases in 01, 10, and 11 states, respectively, results in different read currents Ia, Ib, or Ic. In state 00, however, the fin is not in contact with any gates, and the read current is substantially independent from the read bias voltage. Thus, the read current is low (e.g., at Io). Therefore, the four positions/states of the fin together with their corresponding four read current levels allow the NEMS memory to function as a 2-bit memory cell.

The embodiments of the present disclosure can achieve several technical effects, including providing NEMS structures on bulk substrates with reduced starting substrate cost, reduced thermal stress to the fin, and improved heat dissipation. In addition, the above-discussed embodiments have three gates allowing actuation of the fin as a tri-gate transistor, a source-drain current modulator, or a multi-level memory cell.

The present disclosure enjoys industrial applicability in any of various types of highly integrated semiconductor devices on a single chip, such as CMOS Logic, SRAM, DRAM, volatile and non-volatile memory, and NEMS Logic, SRAM, DRAM, volatile and non-volatile memory. In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a first dielectric layer on a bulk substrate;
source/drain regions directly contacting the bulk substrate;
a fin connecting the source/drain regions;
two gates, one on each side of the fin, the two gates being insulated from the bulk substrate; and
a substrate gate in the bulk substrate, below the fin,
wherein the fin is separated from each of the two gates and the substrate gate with an air gap.

2. The device according to claim 1, further comprising:
the first dielectric layer on the bulk substrate on each side of the substrate gate;
a second dielectric layer on the first dielectric layer, the two gates being insulated from the bulk substrate through the first and second dielectric layers;
a third dielectric layer on side walls of the fin and each of the two gates; and
a fourth dielectric layer on a bottom surface of the fin and a top surface of the substrate gate.

3. The device according to claim 2, wherein:
the fin comprises amorphous silicon (a-Si) or epitaxial Si; and
the fin has a width of 10 Å to 1000 Å and a height of 10 Å to 5000 Å.

4. The device according to claim 3, wherein:
the third dielectric layer has a thickness of 10 Å to 1000 Å;
the fourth dielectric layer has a thickness of 10 Å to 1000 Å;
the air gap between the two gates and the fin has a width of 50 to 100; and
the air gap between the substrate gate and the fin has a thickness of 50 Å to 100 Å.

5. The device according to claim 1, further comprising:
the first dielectric layer on the bulk substrate, the two gates being insulated from the bulk substrate through the first dielectric layer;
a second dielectric layer on side walls of the fin and each of the two gates; and
a third dielectric layer on a bottom surface of the fin and a top surface of the substrate gate.

6. The device according to claim 5, wherein the air gap between the substrate and the fin has a trapezoidal cross-section, the bottom surface of which is coplanar with the top surface of the substrate gate.

7. A method comprising:
forming a first dielectric layer on a bulk substrate;
forming source/drain regions directly contacting the bulk substrate;
forming a fin connecting the source/drain regions;
forming two gates, one gate on each side of the fin, the two gates being insulated from the bulk substrate; and
forming a substrate gate in the bulk substrate, wherein the fin is separated from each of the two gates and the substrate gate with an air gap.

8. The method according to claim 7, comprising forming the fin and the two gates by:
forming a second dielectric layer on the first dielectric layer;
forming the fin through the first and second dielectric layers and extending above the second dielectric layer;
forming the two gates, one gate on each side of the fin and separated from the fin;
forming a third dielectric layer on side walls of the fin and each of the two gates;
removing a portion of the second dielectric layer adjacent to the fin on each side; and
removing a portion of the fin that is substantially coplanar with the second dielectric layer.

9. The method according to claim 8, comprising forming the fin through the first and second dielectric layers by:
forming a fourth dielectric layer on the second dielectric layer;
forming a trench in the first, second, and fourth dielectric layers; and
forming the fin in the trench.

10. The method according to claim 9, comprising forming the fin in the trench by:
depositing amorphous silicon (a-Si) or selectively epitaxially growing Si in the trench.

11. The method according to claim 10, comprising forming the two gates by:
removing the fourth dielectric layer subsequent to forming the fin;
forming spacers on each side of the fin and a fifth dielectric layer on the second dielectric layer; and
forming the two gates on the fifth dielectric layer.

12. The method according to claim 11, further comprising:
removing the spacers on each side of the fin, subsequent to forming the two gates, but prior to forming the third dielectric layer.

13. The method according to claim 12, further comprising:
forming a sixth dielectric layer on a bottom surface of the fin and on a top surface of the substrate gate subsequent to removing the portion of the fin.

14. The method according to claim 9, comprising forming the fin in the trench by:
depositing in the trench a first Si layer to substantially the same thickness as the first dielectric layer, a SiGe layer to substantially the same thickness as the second dielectric layer, and a second Si layer to substantially the same thickness as the fourth dielectric layer.

15. The method according to claim 14, comprising forming the two gates by:
removing the fourth dielectric layer subsequent to forming the fin;
forming spacers on each side of the fin and a fifth dielectric layer on the second dielectric layer; and
forming the two gates on the fifth dielectric layer.

16. The method according to claim 15, further comprising:
removing the spacers on each side of the fin, subsequent to forming the two gates, but prior to forming the third dielectric layer.

17. The method according to claim 16, wherein removing a portion of the fin comprises removing the SiGe layer of the fin, the method further comprising:
forming a sixth dielectric layer on a bottom surface of the fin and a top surface of the substrate gate subsequent to removing the SiGe layer.

18. The method according to claim 7, comprising forming the fin and the two gates by:
removing portions of the bulk substrate to form a fin:
forming the first dielectric layer on each side of the fin;
removing a top portion of the first dielectric layer thereby exposing a top portion of the fin;
forming one of the gates on each side of the fin and separated therefrom; forming a second dielectric layer on the exposed top portion of the fin and side walls of the gates;
removing a portion of the first dielectric layer below a bottom surface of each gate and adjacent each side of the fin; and
removing a portion of the fin that is substantially coplanar with the second dielectric layer.

19. The method according to claim 18, comprising forming the two gates by:
forming spacers on the first dielectric layer, adjacent the exposed top portion of the fin;
depositing a gate on the first dielectric layer adjacent the spacers; and
removing the spacers.

20. The method according to claim 19, further comprising:
forming a third dielectric layer on a bottom surface of the fin and on the top surface of the substrate gate subsequent to removing the portion of the fin.

21. A method comprising:
forming source/drain regions directly on a bulk substrate;
forming a first oxide layer on the bulk substrate;
forming a nitride layer on the first oxide layer;
forming a second oxide layer on the nitride layer;
forming a trench in the first oxide, nitride, and second oxide layers;
doping the substrate through the trench to form a substrate gate in the bulk substrate;
depositing amorphous silicon (a-Si) or selectively epitaxially growing Si in the trench to form a fin, the fin connecting the source/drain regions;
removing the second oxide layer;
forming spacers on each side of the fin and a first dielectric layer on the nitride dielectric layer; and
forming two gates on the first dielectric layer, one gate on each side of the fin and separated from the fin, the two gates being insulated from the bulk substrate;
removing the spacers on each side of the fin;
forming a second dielectric layer on side walls of the fin and each of the two gates;
removing a portion of the nitride layer adjacent to the fin on each side; and
removing a portion of the fin that is substantially coplanar with the nitride layer, wherein the fin is separated from each of the two gates and the substrate gate with an air gap.

* * * * *